US008517542B2

(12) United States Patent
Endo et al.

(10) Patent No.: US 8,517,542 B2
(45) Date of Patent: Aug. 27, 2013

(54) LASER ILLUMINATION DEVICE, ILLUMINATION METHOD, SEMICONDUCTOR ELEMENT MANUFACTURING METHOD, PROJECTION DISPLAY DEVICE, AND IMAGE DISPLAY METHOD USING THE PROJECTION DISPLAY DEVICE

(75) Inventors: Takao Endo, Tokyo (JP); Shuhei Yamamoto, Tokyo (JP); Yoshihito Hirano, Tokyo (JP); Yasuhisa Tamagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 464 days.

(21) Appl. No.: 12/996,888

(22) PCT Filed: Apr. 23, 2010

(86) PCT No.: PCT/JP2010/057255
§ 371 (c)(1),
(2), (4) Date: Dec. 8, 2010

(87) PCT Pub. No.: WO2010/125978
PCT Pub. Date: Nov. 4, 2010

(65) Prior Publication Data
US 2011/0090462 A1    Apr. 21, 2011

(30) Foreign Application Priority Data
Apr. 30, 2009    (JP) .................................. 2009-111296

(51) Int. Cl.
*G03B 21/14*    (2006.01)
(52) U.S. Cl.
USPC ............................ 353/94; 362/553; 250/492.1
(58) Field of Classification Search
USPC ............... 353/94, 30, 31; 362/553, 554, 556, 362/559, 561; 385/115, 116, 129, 133, 901; 250/492.1, 494.1
See application file for complete search history.

(56) References Cited

U.S. PATENT DOCUMENTS

| 7,014,318 B2 * | 3/2006 | Dho ................................ 353/31 |
| 7,413,311 B2 * | 8/2008 | Govorkov et al. ............... 353/34 |
| 7,703,930 B2 * | 4/2010 | Plut ............................... 353/119 |

(Continued)

FOREIGN PATENT DOCUMENTS

| JP | 11 038901 | 2/1999 |
| JP | 2004 214225 | 7/2004 |

(Continued)

OTHER PUBLICATIONS

International Search Report issued Jun. 1, 2010 in PCT/JP10/057255 filed Apr. 23, 2010.

*Primary Examiner* — William C Dowling
(74) *Attorney, Agent, or Firm* — Oblon, Spivak, McClelland, Maier & Neustadt, L.L.P.

(57) ABSTRACT

A laser illumination device for providing a light intensity distribution of a high-intensity and uniform illumination light flux is obtained. The device includes a plurality of light source modules (20) each including: a plurality of light source units (8), in each of which a semiconductor laser (1), and a laser medium (5) and a nonlinear material (7) which are flat-shaped and have a waveguide structure are arranged on the same plane, for performing continuous oscillation in a waveguide mode of the laser medium (5); and a first optical system (12) for coupling laser oscillation beams from the plurality of light source units (8). The device further includes: a second optical system (15) for coupling laser light beams propagating from the plurality of light source modules (20) through first optical fibers (13) and a second optical fiber array (14); a uniformization element (16) for converting a laser light beam from the second optical system (15) into a uniform laser light beam; and a third optical system (17) for projecting, to a substrate (19) which is an illuminated surface (18), the uniform laser light beam obtained through the uniformization element (16) at a predetermined magnification, to produce an illumination light flux (11).

6 Claims, 20 Drawing Sheets

(56) References Cited

U.S. PATENT DOCUMENTS

| | | | |
|---|---|---|---|
| 7,950,808 B2* | 5/2011 | Kojima et al. | 353/94 |
| 2004/0239818 A1 | 12/2004 | Sugiyama et al. | |
| 2006/0268241 A1* | 11/2006 | Watson et al. | 353/94 |
| 2007/0070302 A1* | 3/2007 | Govorkov et al. | 353/94 |
| 2008/0252863 A1 | 10/2008 | Kojima et al. | |
| 2010/0182573 A1* | 7/2010 | Itoh et al. | 353/30 |
| 2010/0210911 A1* | 8/2010 | Shimotsu | 600/178 |

FOREIGN PATENT DOCUMENTS

| | | |
|---|---|---|
| JP | 2004 279943 | 10/2004 |
| JP | 2007 115729 | 5/2007 |
| JP | 2008 053317 | 3/2008 |
| JP | 2008 147428 | 6/2008 |
| JP | 2008 268271 | 11/2008 |

* cited by examiner

MOVEMENT OF STAGE

MOVEMENT OF STAGE

LASER ILLUMINATION DEVICE, ILLUMINATION METHOD, SEMICONDUCTOR ELEMENT MANUFACTURING METHOD, PROJECTION DISPLAY DEVICE, AND IMAGE DISPLAY METHOD USING THE PROJECTION DISPLAY DEVICE

TECHNICAL FIELD

The present invention relates to a laser illumination device for providing a light intensity distribution of a high-intensity and uniform illumination light flux, an illumination method, a semiconductor element manufacturing method, a projection display device, and an image display method using the projection display device.

BACKGROUND ART

One of flat panel displays (FPDs) realizing a thin and large screen is a liquid crystal display (LCD). For example, low-temperature poly-Si (LTPS), which may be produced at low temperature, is used for a thin film transistor (TFT) of the liquid crystal display.

A laser anneal process is generally used to form a poly-crystal silicon (p-Si) thin film in a LTPS production line. Unlike amorphous silicon (a-Si), the polycrystal silicon has a partially crystalline structure and is produced as follows. Plasma-enhanced chemical vapor deposition (PECVD) is used to form an a-Si thin film (approximately 50 nm to 100 nm) on a glass substrate. The glass substrate is scanned on a stage with a laser beam to melt and recrystallize the a-Si film. A laser anneal apparatus for performing the laser anneal process as described above is publicly known (see, for example, Patent Literature 1).

A projection display device uses a laser light as a light source to display an image on a screen. Unlike a cathode ray tube (CRT) display and a plasma display panel (PDP), the projection display device is a non-emission display device and includes a light valve for adjusting a light amount based on an image signal, an illumination optical system for illuminating the light valve with illumination light from the light source, and a projection optical system for enlargedly projecting a small image formed by the light valve to a large screen.

CITATION LIST

Patent Literature

[PTL 1]: JP 2004-349635 A
[PTL 2]: JP 2004-214225 A

SUMMARY OF INVENTION

Technical Problem

In the conventional technology as described in Patent Literature 1, a large number of laser light sources each having a small output are used and laser beams are coupled to a fiber to maintain a power density. When fibers are arranged in array, for example, in line, an illumination light flux may be roughly formed into a line shape. However, the respective fibers are merely arranged in the fiber array, and hence the respective intensity distributions remain in the illumination light flux as they are. For example, when five circular fibers are arranged in a row, five circular illumination light beams are arranged in a row. After that, when magnification is adjusted by a beam formation optical system, light intensities and illumination regions may be changed. However, the intensity distributions of the respective fibers which are caused by the fiber array are not eliminated. The light intensity distribution of the illumination light flux is not uniform, and hence the polycrystal silicon is non-uniformly produced by annealing.

In the conventional technology as described in Patent Literature 2, a large number of laser light sources each having a small output are used and a plurality of laser light beams are coupled to respective corresponding fibers to pass through optical fiber cables. The laser light beams are finally combined to a single optical fiber cable to obtain a single laser output. However, there is a problem that, even when the light valve is illuminated with the illumination light flux from the fiber by a lens or the like, the light valve is not uniformly illuminated because the light intensity distribution of the illumination light flux is not uniform.

The present invention has been made to solve the problems as described above and an object of the present invention is to obtain a laser illumination device capable of providing a light intensity distribution of a high-intensity and uniform illumination light flux, an illumination method, a semiconductor element manufacturing method, a projection display device, and an image display method using the projection display device.

Solution to Problem

A laser illumination device according to the present invention includes: a plurality of light source modules each including: a plurality of light source units, in each of which a semiconductor laser, and a laser medium and a nonlinear material which are flat-shaped and have a waveguide structure are arranged on the same plane, for performing continuous oscillation in a waveguide mode of the laser medium; and a first optical system for coupling laser oscillation beams from the plurality of light source units; a second optical system for coupling laser light beams propagating from the plurality of light source modules through first optical fibers and a second optical fiber array; a uniformization element for uniformizing a laser light beam from the second optical system; and a third optical system for projecting the laser light beam uniformized through the uniformization element, to a substrate which is an illuminated surface at a predetermined magnification, to produce an illumination light flux.

Further, a laser illumination method according to the present invention includes the steps of: coupling laser oscillation beams from a plurality of light source units by a plurality of light source modules, the plurality of light source modules each including: the plurality of light source units, in each of which a semiconductor laser, and a laser medium and a nonlinear material which are flat-shaped and have a waveguide structure are arranged on the same plane, for performing continuous oscillation in a waveguide mode of the laser medium; and a first optical system for coupling laser oscillation beams from the plurality of light source units; coupling, by a second optical system through a second optical fiber array, laser light beams propagating from the plurality of light source modules through first optical fibers; uniformizing a laser light beam from the second optical system by a uniformization element; and projecting, by a third optical system, the laser light beam uniformized through the uniformization element, to a substrate which is an illuminated surface at a predetermined magnification, to produce an illumination light flux.

Further, a semiconductor element manufacturing method according to the present invention includes a polycrystallization step of: using the laser illumination method described above to temporally continuously drive the semiconductor laser; and forming a polycrystal silicon film on a surface of the substrate while a relative position of the substrate is adjusted to align a surface of the substrate to the illuminated surface.

Further, a projection display device according to the present invention includes: a light source including a plurality of light source modules each including: a plurality of light source units, in each of which a semiconductor laser, and a laser medium and a nonlinear material which are flat-shaped and have a waveguide structure are arranged on the same plane, for performing continuous oscillation in a waveguide mode of the laser medium; and a first optical system for coupling laser oscillation beams from the plurality of light source units; an illumination optical system including: a second optical system for coupling laser light beams propagating from the plurality of light source modules through first optical fibers and a second optical fiber array; a uniformization element for uniformizing a laser light beam from the second optical system; and a third optical system for illuminating a light valve which is an illuminated surface with the laser light beam uniformized through the uniformization element; and a projection optical system for projecting an image formed by the light valve at a predetermined magnification.

Further, an image display method using a projection display device according to the present invention includes: a first step of emitting laser light beams from a plurality of light source modules each including: a plurality of light source units, in each of which a semiconductor laser, and a laser medium and a nonlinear material which are flat-shaped and have a waveguide structure are arranged on the same plane, for performing continuous oscillation in a waveguide mode of the laser medium; and a first optical system for coupling laser oscillation beams from the plurality of light source units; a second step of coupling the laser light beams propagating through first optical fibers and a second optical fiber array, uniformizing a laser light beam obtained by the coupling, and illuminating a light valve which is an illuminated surface with the uniformized laser light beam; and a step of projecting an image formed by the light valve at a predetermined magnification.

Advantageous Effects of Invention

According to the present invention, the light fluxes from the plurality of light source units may be coupled and uniformized to provide a light intensity distribution of a high-intensity and uniform illumination light flux.

DESCRIPTION OF EMBODIMENTS

Embodiment 1

Figure 1:
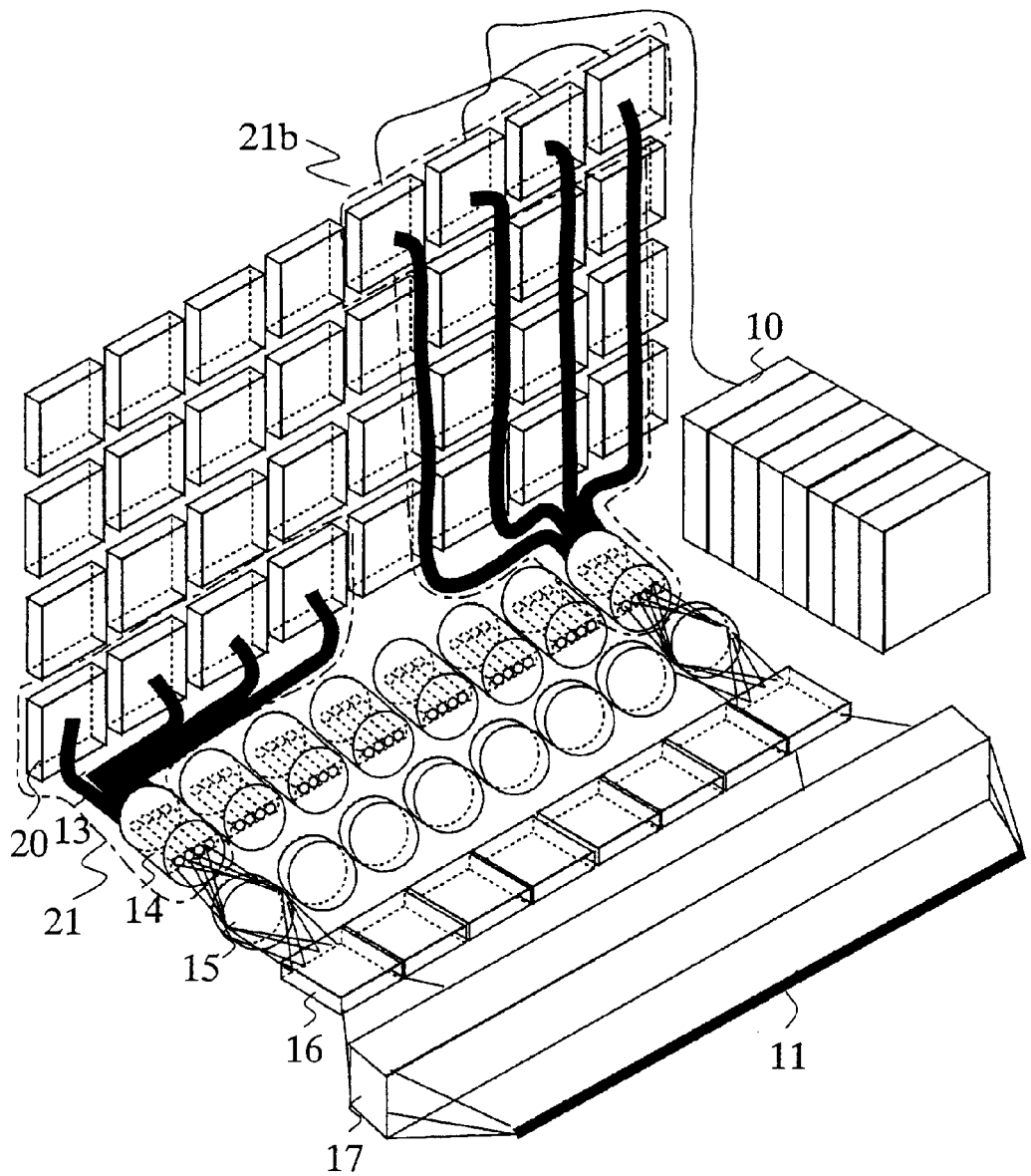
FIG. 1 An entire structural view illustrating a laser illumination device according to the present invention.

FIG. 1 is an entire structural view illustrating a laser illumination device according to the present invention. Illumination light beams from a plurality of light source modules 20 are formed into a beam shape and guided to an illuminated surface 18 (not shown in FIG. 1) while an intensity distribution is uniformized. The light source modules 20 are paired with a plurality of first optical fibers 13 and arranged therewith. As illustrated in FIG. 1, the pairs of the light source modules 20 and the first optical fibers 13 are arranged in up, down, left, and right directions. However, the present invention is not limited to this. The plurality of (four in FIG. 1) first optical fibers 13 are connected to a second optical fiber array 14. The second optical fiber array 14 includes individual fibers arranged therein. In FIG. 1, four optical fibers are arranged in a row. The arrangement is changed based on the purpose of beam formation, and thus the present invention is not limited to this.

Illumination light beams from the second optical fiber array 14 are guided to a flat-shaped uniformization element 16 through a second optical system 15. The illumination light beams uniformized during propagation through an inner portion of the uniformization element 16 are guided to the illuminated surface 18 (not shown in FIG. 1) by a third optical system 17. In this example, the four light source modules 20, the four first optical fibers 13, and the single optical fiber array 14 serve as a single illumination module 21. The numbers of light source modules 20 and first optical fibers 13, which are included in the illumination module 21, depend on, for example, illumination light powers and power densities, and hence the present invention is not limited to this. A control device 10 controls the respective light source modules 20 included in the illumination module 21 to perform, for example, the supply of powers and the adjustment of light powers. In FIG. 1, reference numeral 11 denotes an illumination light flux on the illuminated surface.

Figure 2:
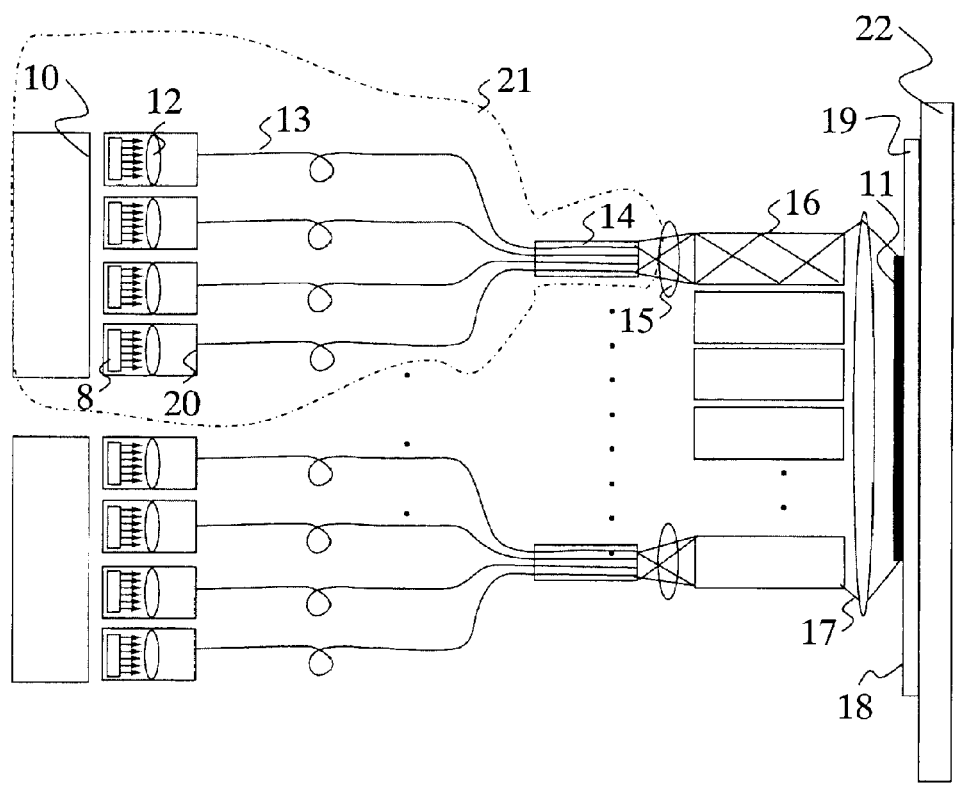
FIG. 2 A plan view illustrating a structure of the laser illumination device of FIG. 1 in a case where an optical fiber array 14 including four optical fibers arranged in a row is viewed from above.
Figure 3:
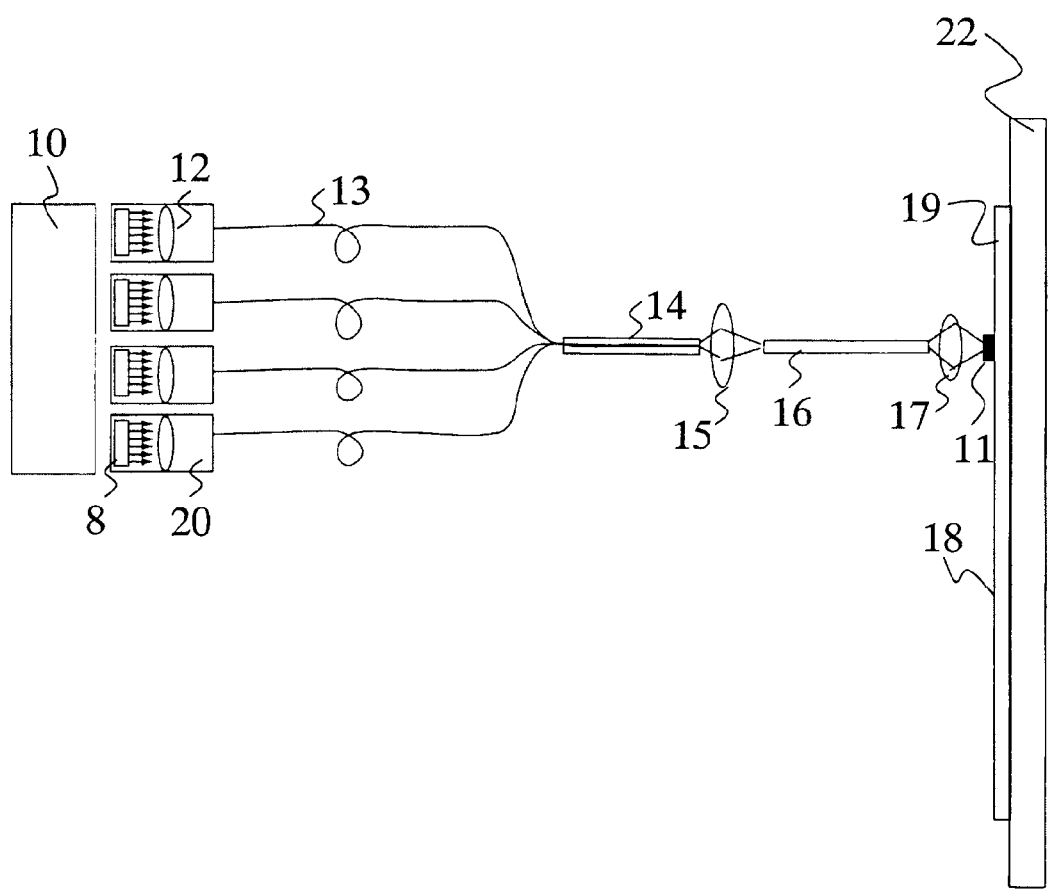
FIG. 3 A plan view illustrating the structure of the laser illumination device of FIG. 1 in a case where the optical fiber array 14 including the four optical fibers arranged in the row is viewed from side.

FIGS. 2 and 3 are plan views illustrating a structure of the laser illumination device of FIG. 1. In the example illustrated in FIG. 1, the four optical fibers 13 are arrayed in the row, and hence FIGS. 2 and 3 illustrate the downstream parts (direction from light source to illuminated surface) from the optical fiber array 14 as being orthogonal to each other. To be specific, FIG. 2 illustrates a structure in a case where the optical fiber array 14 including the four optical fibers arranged in the row is viewed from above, and FIG. 3 illustrates a structure in a case where the optical fiber array 14 is viewed from side. The upstream parts (light source side) from the optical fiber array 14 are common to illustrate the four optical fibers.

The light source modules 20 each include a light source unit 8 having a plurality of emitters and a first coupling optical system 12. Laser oscillation light beams from the light source unit 8 are guided to the first optical fiber 13 through the first coupling optical system 12. In the example illustrated in FIGS. 2 and 3, light beams from six emitters serving as the light source unit 8 are guided to the first optical fiber 13. However, the number of emitters depends on, for example, illumination light powers and power densities, and hence the present invention is not limited to this.

Figure 4:
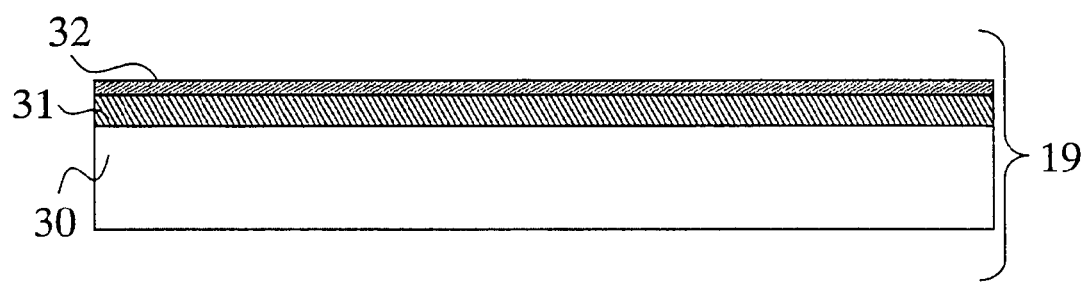
FIG. 4 A cross sectional view illustrating a structure of an annealed substrate 19 of FIGS. 2 and 3.

As illustrated in FIG. 4, in an annealed substrate 19, a base film 31 is formed on at least an insulating substrate 30 and an amorphous silicon film 32 is formed on the base film 31. The annealed substrate 19 is set on a movable stage 22 and adjusted in position so that the amorphous silicon film 32 on a surface side is located on the illuminated surface 18 of a laser illumination optical system.

Next, an operation is described. Power is supplied from the control device 10 to each of the light source modules 20 to perform, for example, the adjustment of oscillated laser light powers. In FIG. 1, the single illumination module 21 includes the four light source modules 20. For example, on the assumption of failure or maintenance, the control device 10 controls to supply power to the three light source modules 20 and to stop power supply to the remaining one light source module 20. Laser light beams from the light source modules 20 are guided to the second optical fiber array 14 through the first optical fibers 13. In the example illustrated in FIG. 1, the second optical fiber array 14 includes the four fibers arranged in the row, and hence light beams are output from the three fibers on a light exit surface of the second optical fiber array 14. However, the remaining one fiber outputs no light beam because of being turned off. In other words, three bright points and one dark point may be recognized.

The illumination light flux from the optical fiber array 14 is guided to the uniformization element 16 through the second optical system 15 for laser light coupling. During propagation through the uniformization element 16, the light beams output from the fiber array 14 having the row arrangement are mixed and uniformized in plane. Therefore, the bright and dark points which may be recognized on the light exit surface of the optical fiber array 14 are formed as uniform and square light on a light exit surface of the uniformization element 16. The illumination light from the uniformization element 16 is formed by the third optical system 17 so that an illumination region is expanded by different projection magnification factors in longitudinal and lateral directions, and guided to the illuminated surface 18. Thus, the illumination light flux 11 as illustrated in FIGS. 1 and 2 is obtained.

Figure 5:
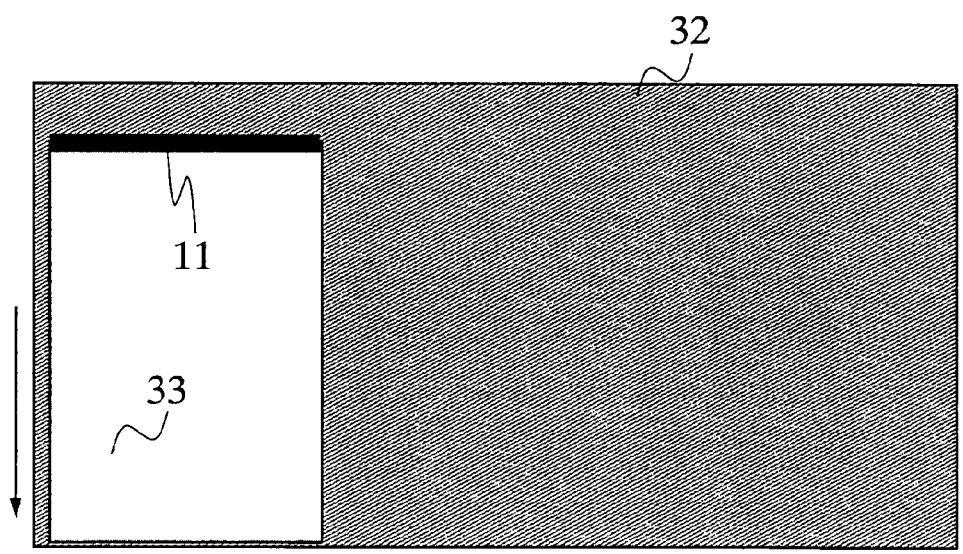
FIG. 5 A view illustrating a step of melting and recrystallizing an amorphous silicon film 32 of an annealed substrate 9 of FIG. 4 by the absorption of light energy to form a polycrystal silicon film 33.
Figure 6:
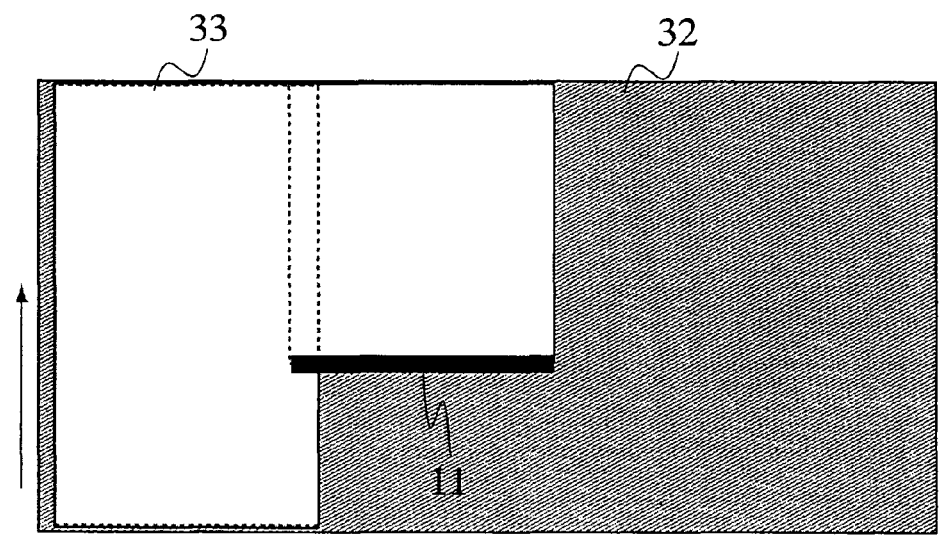
FIG. 6 A view illustrating a step of forming the polycrystal silicon films 33 with end areas being overlapped with each other.

The annealed substrate 19 is set on the movable stage 22 and adjusted in position to align the surface of the substrate with the illuminated surface 18 of the laser illumination optical system. The movable stage 22 moves relative to the illumination light, and hence the annealed substrate 19 is scanned with the illumination region. In a case where a laser wavelength is selected in a range of 400 [nm] to 600 [nm], when the amorphous silicon film is melted and recrystallized by effective absorption of light energy, a polycrystal silicon film may be formed, because amorphous silicon has a larger absorption coefficient than polycrystal silicon. That is, as illustrated in FIGS. 5 and 6, the movable stage 22 is moved relative to the illumination light flux 11 on the illuminated surface 18 to melt and recrystallize the amorphous silicon film 32 of the annealed substrate 19 which is an illuminated object by effective absorption of light energy, and hence a polycrystal silicon film 33 may be formed. Note that, FIG. 6 illustrates that the polycrystal silicon films 33 are formed with end areas being overlapped with each other. When the light sources are CW-driven (Continuous Wave-driven), that is, when a semiconductor laser 1 is temporally continuously driven to emit laser light, instantaneous high energy is not provided unlike pulse driving. Therefore, a uniform polycrystal silicon film may be formed without an irradiation trace.

An increase in substrate size is required because of market needs. When the scanning speed of the stage is not changed and the illumination region is not expanded, a scanning time corresponding to an increased substrate size is necessary, and hence production capability reduces. In other words, in order to obtain the same production amount, it is necessary to expand the illumination region (or to increase scanning speed). Therefore, a light source having a large light output is required as a matter of course. However, a single large-output laser is expensive, and involves another problem of an increase in size of a device (including optical system for beam formation). However, as in the structure described above, when the light beams from the light sources having the small light outputs are collected using the plurality of fibers, the beam formation is performed while the light outputs (power densities) from the light source modules 20 are maintained. Thus, when the number of light sources is merely increased, the illumination region may be expanded while the power densities are maintained.

In the structure as described above, the light beams from the plurality of separate light sources are mixed. Therefore, when the number of light beams to be mixed is denoted by N, a statistical fluctuation is reduced proportional to $1/\sqrt{N}$, and hence the structure has an effect capable of reducing unevenness caused by high laser coherence, for example, internal interference of an optical system or a speckle noise.

The laser illumination device as described above is continuously used as an industrial machine at any time of day or night. It is particularly important for the industrial machine to shorten a recovery time from the occurrence of defect and to facilitate maintenance. The light source modules larger in number than purpose are flexibly provided in advance and the intensities are uniformized by the uniformization element 16.

Therefore, for example, when a defect occurs in which a light source is not turned on, an auxiliary light source module, which is not originally turned on, is turned on and the light source module 20 in which the defect occurs is turned on, and hence the recovery from the defect may be performed. The uniformization element 16 is located downstream of the second optical fiber array 15 to obtain a uniform intensity for each of the illumination modules 21, and hence repair and replacement may be performed while the light source modules 20 and the first optical fibers 13 which are located upstream thereof are being in use as the laser illumination device.

Figure 7:
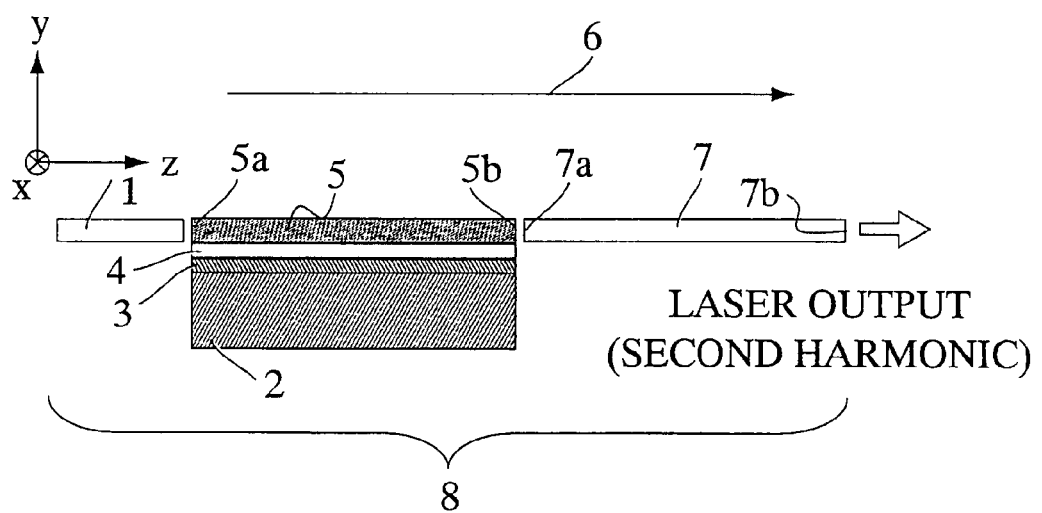
FIG. 7 A side view illustrating an example of a structure of a light source unit 8 applied to the present invention.
Figure 8:
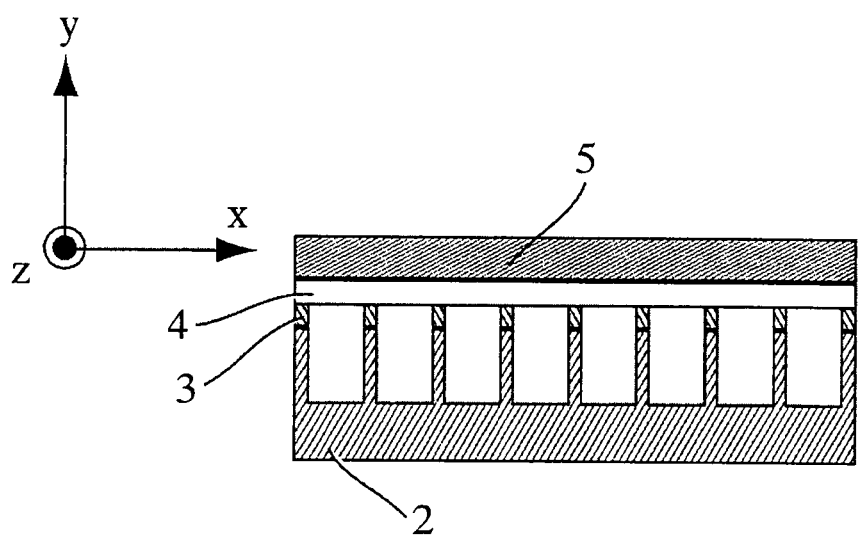
FIG. 8 A cross sectional view illustrating the example of the structure of the light source unit 8 applied to the present invention as viewed from a nonlinear material side.

FIGS. 7 and 8 are a side view illustrating an example of a structure of the light source unit 8 applied to the present invention and a cross sectional view thereof in a case where a cross section is viewed from a nonlinear material side. As illustrated in FIGS. 7 and 8, the light source unit 8 includes: the semiconductor laser 1; a flat-shaped laser medium 5 having a waveguide structure in a thickness direction of a cross section perpendicular to an optical axis 6 exhibiting a laser oscillation direction, so as to have a periodic lens effect in a direction perpendicular to the optical axis 6 and the thickness direction; a clad 4 bonded to a lower surface of the laser medium 5; a heat sink 2 bonded through a bonding material 3 to a lower surface of the clad 4 bonded to the lower surface of the laser medium 5; and a nonlinear material 7 which is provided close to the laser medium on the optical axis and has a waveguide structure in the same direction as the waveguide structure of the laser medium 5.

The heat sink 2 is made of a material having a large heat conductivity and has a comb shape on a cross section (xy-plane) perpendicular to the optical axis 6. Tip end portions of the comb teeth of the heat sink 2 are bonded to the clad 4 through the bonding material 3.

The bonding material 3 exhausts heat generated in the laser medium 5 to the heat sink 2 through the clad 4. The semiconductor laser 1 is provided close to an end surface 5a of the laser medium 5, and bonded to a heat sink for cooling (not shown) if necessary. A length of the semiconductor laser 1 in an x-axis direction is substantially equal to a length of the laser medium 5 in the x-axis direction, and hence substantially uniform excitation light is output in the x-axis direction. The excitation light output from the semiconductor laser 1 enters the laser medium 5 from the end surface 5a in an xz-plane direction and is absorbed in the laser medium 5. The nonlinear material 7 has substantially the same shape as the laser medium 5 with respect to a cross section perpendicular to the optical axis 6, includes end surfaces 7a and 7b perpendicular to the optical axis 6, and is provided so that the end surface 7a is close to an end surface 5b of the laser medium 5.

The end surface 5a of the laser medium 5 is applied with a total-reflection film for reflecting fundamental laser light and the end surface 5b thereof is applied with an antireflection film for transmitting the fundamental laser light. The end surface 7a of the nonlinear material 7 is applied with an optical film for transmitting the fundamental laser light and reflecting second harmonic laser light and the end surface 7b thereof is applied with an optical film for reflecting the fundamental laser light and transmitting the second harmonic laser light. The total-reflection film, the partial reflection film, and the optical films are provided by laminating, for example, dielectric thin films. When the excitation light output from the semiconductor laser 1 enters the laser medium 5 from the end surface 5a, the total-reflection film of the end surface 5a is an optical film for transmitting the excitation light and reflecting the fundamental laser light.

The laser medium 5 converts a part of power of the absorbed excitation light into heat to generate heat. The heat sink 2 has the comb shape in which only the tip end portions of the comb teeth are bonded through the bonding material 3, and hence heat flows from a substantially intermediate point between two comb teeth to both sides in the x-axis direction in an intermediate portion between the two comb teeth. Therefore, in a temperature distribution of an inner portion of the laser medium 5, a temperature of the substantially intermediate point between two comb teeth is maximum, and a temperature decreases with a reduction in distance from a comb tooth portion.

An optical material, for example, the laser medium 5 has a refractive index changed substantially proportional to a temperature difference. The excitation light from the semiconductor laser 1, which enters the laser medium 5, is substantially uniformly excited in the x-axis direction. The comb teeth of the heat sink 2 are arranged at substantially regular intervals in the x-axis direction. Therefore, the heat lens effect is periodically generated. When the number of comb teeth is denoted by m, the same effect as in a case where (m−1) lenses are arranged at substantially regular intervals is obtained.

Figure 9:
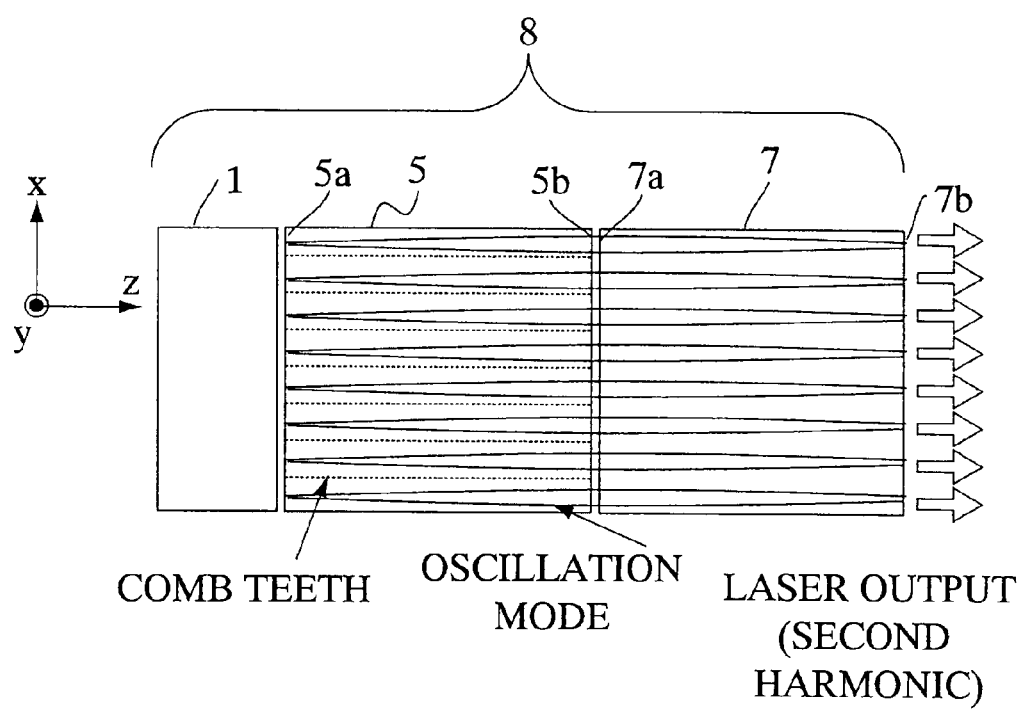
FIG. 9 A view illustrating the light source unit 8 of FIG. 7 viewed from a z-axis direction.

FIG. 9 illustrates the light source unit 8 of FIG. 7 viewed from a z-axis direction. To clearly exhibit a relationship between an oscillation mode of the fundamental laser light and the comb teeth of the heat sink 2, the comb teeth are indicated by broken lines to be able to visually recognize the comb teeth of the heat sink 2.

The excitation light entering the laser medium 5 from the end surface 5a is absorbed in the laser medium 5, and hence a gain for the fundamental laser light is generated in the inner portion of the laser medium 5. The fundamental laser light is laser-oscillated between the end surface 5a of the laser medium 5, which is perpendicular to the optical axis 6, and the end surface 7b of the nonlinear material 7, based on the gain generated in the inner portion of the laser medium 5.

The nonlinear material 7 is optimized in crystal axis angle, temperature, or periodically poled period so that, when the fundamental laser light enters the nonlinear material 7, the fundamental laser light is converted into the second harmonic laser light by a nonlinear effect. Therefore, when the fundamental laser light oscillated between the end surface 5a and the end surface 7a enters the nonlinear material 7, a part of the fundamental laser light is converted into the second harmonic laser light and output from the end surface 7b to the outside.

A remaining part of the fundamental laser light which is not converted into the second harmonic laser light is totally reflected on the end surface 7b, passes through the nonlinear material 7 again, and is converted into second harmonic laser light. The second harmonic laser light generated by converting the remaining part of the fundamental laser light is totally reflected on the end surface 7a and output from the end surface 7b to the outside.

According to such a structure, the second harmonic laser light beams having the plurality of wavelengths may be simultaneously output from the single semiconductor laser.

A general solid laser material may be used for the laser medium 5. For example, Nd:YAG, Nd:YLF, Nd:Glass, Nd:YVO$_4$, Nd:GdVO$_4$, Yb:YAG, Yb:YLF, Yb:KGW, Yb:KYW, Er:Glass, Er:YAG, Tm:YAG, Tm:YLF, Ho:YAG, Ho:YLF, Tm,Ho:YAG, Tm,Ho:YLF, Ti:Sapphire, or Cr:LiSAF is used.

A general wavelength conversion material may be used as the nonlinear material 7. For example, KTP, KN, BBO, LBO, CLBO, LiNbO$_3$, or LiTaO$_3$ is used. When MgO-doped LiNbO$_3$, MgO-doped LiTaO$_3$, stoichiometric LiNbO$_3$, or stoichiometric LiTaO$_3$ each of which is highly resistant to optical damage is used, the power density of the incident fundamental laser light may be increased, and hence high-efficiency wavelength conversion may be achieved. When MgO-doped LiNbO$_3$, MgO-doped LiTaO$_3$, stoichiometric LiNbO$_3$, stoichiometric LiTaO$_3$, or KTP each of which has a periodically poled structure is used, higher-efficiency wavelength conversion may be achieved because of a large nonlinear constant.

According to such a structure, the second harmonic laser light beams having the plurality of wavelengths may be simultaneously output from the single semiconductor laser. Therefore, a low-cost light source unit may be provided because of space saving.

Embodiment 2

Figure 10:
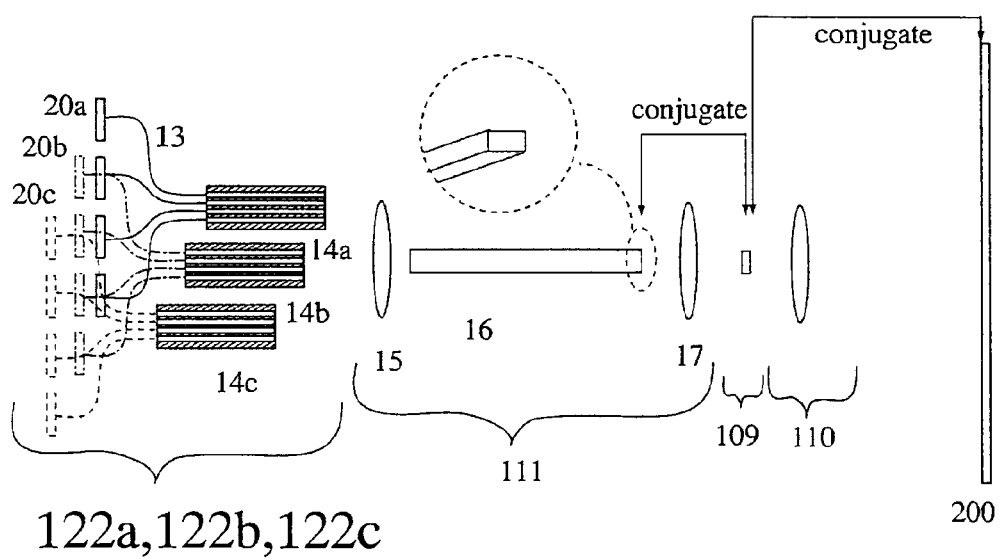
FIG. 10 An entire structural view illustrating a projection display device including a laser illumination device according to Embodiment 2 of the present invention.

FIG. 10 is an entire structural view illustrating a projection display device including a laser illumination device according to Embodiment 2 of the present invention. With respect to laser illumination illustrated in FIG. 10, illumination light beams from a plurality of light source modules 20 are formed into a beam shape and guided to a light valve 109 which is an illuminated surface while an intensity distribution is uniformized. The light source modules 20 are paired with a plurality of first optical fibers 13 and arranged therewith.

FIG. 10 illustrates three kinds of light sources 122a, 122b, and 122c each including the four light source modules 20. However, it is sufficient that at least one light source is provided, and thus the number of light sources is not specifically limited. In a CRT display, a PDP, and a projection display device, colors are generally produced by a combination of at least three kinds of light beams having different wavelengths, and hence three kinds of light source modules having different wavelengths may be prepared.

An illumination light flux from the second optical fiber array 14 is guided to the uniformization element 16 through the second optical system 15 for laser light coupling. The bright and dark points may be recognized on a light exit surface of the second optical fiber array 14. However, during propagation through the uniformization element 16, light beams output from the fiber array are mixed and uniformized in plane. Therefore, uniform and square light is formed on a light exit surface of the uniformization element 16.

The light valve 109 which is the illuminated surface is uniformly illuminated with the illumination light from the uniformization element 16 by the third optical system 17. The uniform and square light is formed on the light exit surface of the uniformization element 16, and hence the light valve 109 is uniformly illuminated in a case where the light exit surface of the uniformization element 16 and the light valve 109 are arranged optically conjugate with each other.

A system from the second optical system 15 for laser light coupling to the third optical system 17 for illuminating the light valve 109 serves as the illumination optical system. An image formed by the light valve 109 is enlargedly projected to a screen 200 by a projection optical system 110. When the screen 200 and the light valve 109 are also arranged optically conjugate with each other, a uniform and clear image may be formed on the screen.

Figure 11:
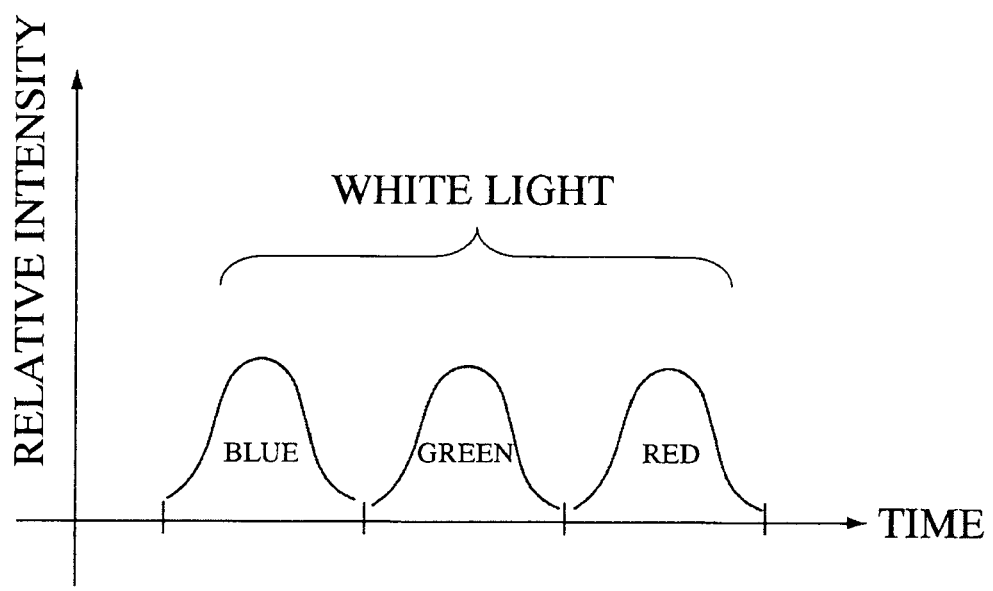
FIG. 11 A diagram illustrating a state in which three primary colors of red, green, and blue are temporally switched ON/OFF.

FIG. 11 illustrates a state in which three primary colors of red, green, and blue are temporally switched ON/OFF. As illustrated in FIG. 11, for example, when the light sources 122 are controlled to temporally switch ON/OFF the three primary colors of red, green, and blue at a higher speed than an eye response speed, which may be generally approximately 30 Hz, a colored image may be formed.

The projection display device is classified into a rear projection type for projecting image light from a rear surface of a screen as viewed from an observer and a front projection type for projecting image light from a front surface of the screen as viewed from the observer.

Figure 12:
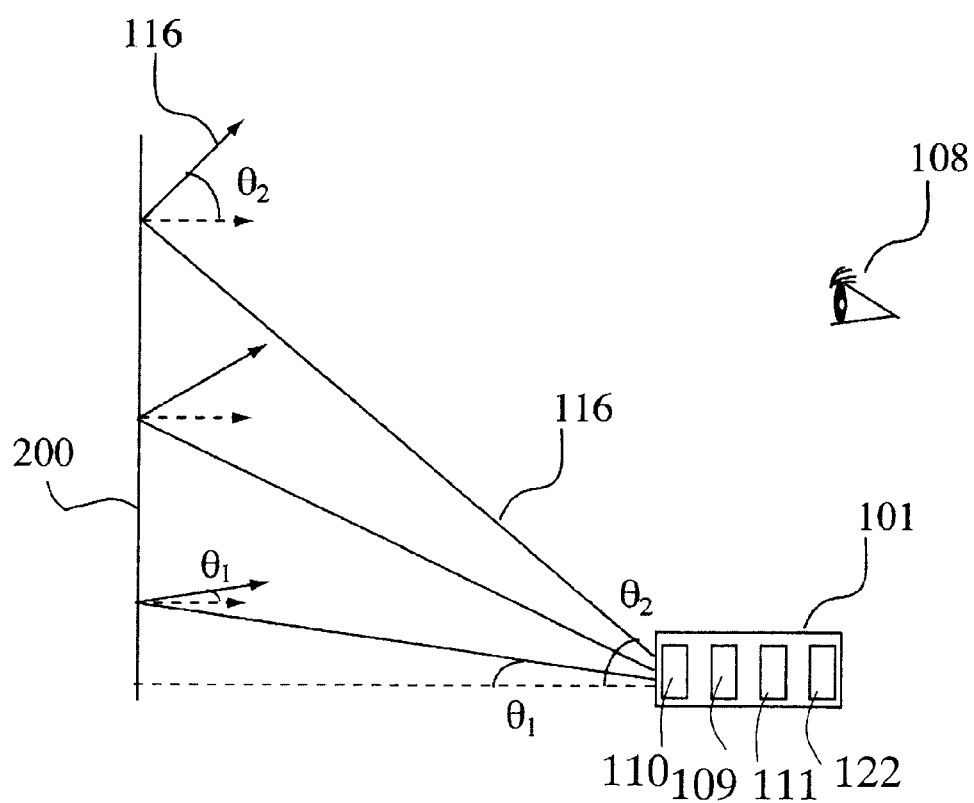
FIG. 12 A view illustrating an example of a front projection display device according to Embodiment 2 of the present invention.

FIG. 12 illustrates an example of a front projection display device according to Embodiment 2 of the present invention. A projector 101 includes at least the light valve 109 for adjusting the amount of light based on an image signal, an illumination optical system 111 for illuminating the light valve 109 with illumination light from the light source 122, and the projection optical system 110 for enlargedly projecting a small image formed by the light valve 109 to the large screen 200.

The projector 101 is used in combination with the screen 200 for displaying the image in many cases, and thus illustrated therewith. However, the front projection display device does not include the screen 200, and thus includes only the projector 101.

When the projector 101 includes the light source 122, the illumination optical system 111, the light valve 109, and the projection optical system 110 as described above, a uniform and clear image may be formed on the screen.

Embodiment 3

FIG. 10 of Embodiment 2 illustrates the example of the plurality (three kinds) of light sources 122a, 122b, and 122c. In contrast to this, another structure for the three primary colors of red, green, and blue is described in Embodiment 3 of the present invention.

Figure 13:
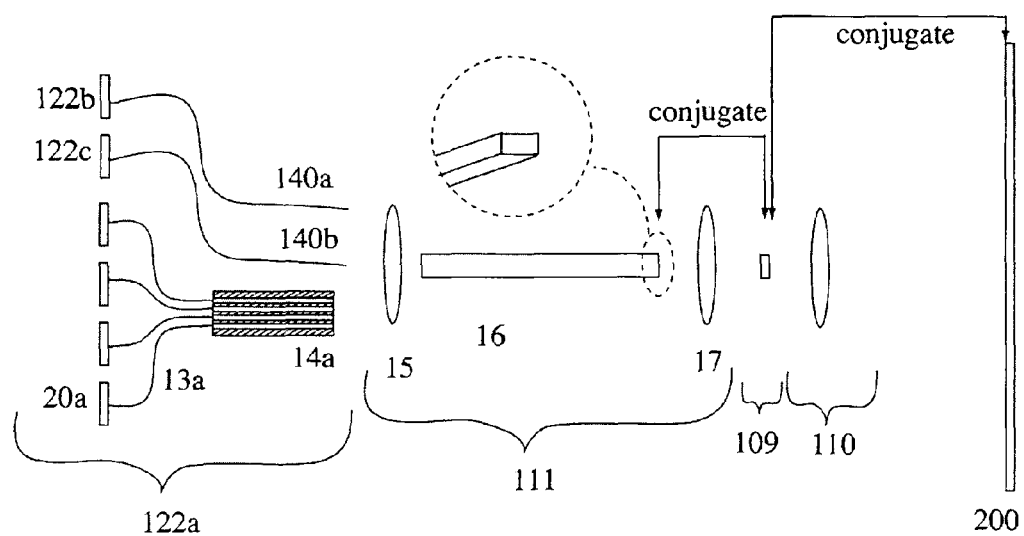
FIG. 13 An entire structural view illustrating a projection display device including a laser illumination device according to Embodiment 3 of the present invention.

FIG. 13 is an entire structural view illustrating a projection display device including a laser illumination device according to Embodiment 3 of the present invention. As illustrated in FIG. 13, the separated light sources 122b and 122c and third optical fibers 140a and 140b may be used. An illumination light flux from a second optical fiber array 14a is guided to the uniformization element 16 through the second optical system 15 for laser light coupling.

An illumination light flux from the light source 122b propagates through the third optical fiber 140a and is guided to the uniformization element 16 through the second optical system 15 for coupling. Similarly, an illumination light flux from the light source 122c propagates through the third optical fiber 140b and is guided to the uniformization element 16 through the second optical system 15 for coupling.

During propagation through the uniformization element 16, the light beams output from the light sources 122a, 122b, and 122c are mixed and uniformized in plane (spatially). The structure provided after the uniformization element 16 is equal to the structure illustrated in FIG. 10 of Embodiment 2, and thus the description thereof is omitted. At least three kinds of light sources are necessary, but naturally the number of kinds thereof may be equal to or larger than three.

When the projector 101 includes the light source 122, the illumination optical system 111, the light valve 109, and the projection optical system 110 as described above, a uniform and clear image may be formed on the screen.

Embodiment 4

In Embodiment 4 of the present invention, a rear projection display device is described.

The rear projection display device is a device for projecting image light from the rear surface of the screen as viewed from the observer. The rear projection display device includes at least the projector 101 described in Embodiment 2 or 3 and a transmission screen 129.

Figure 14:
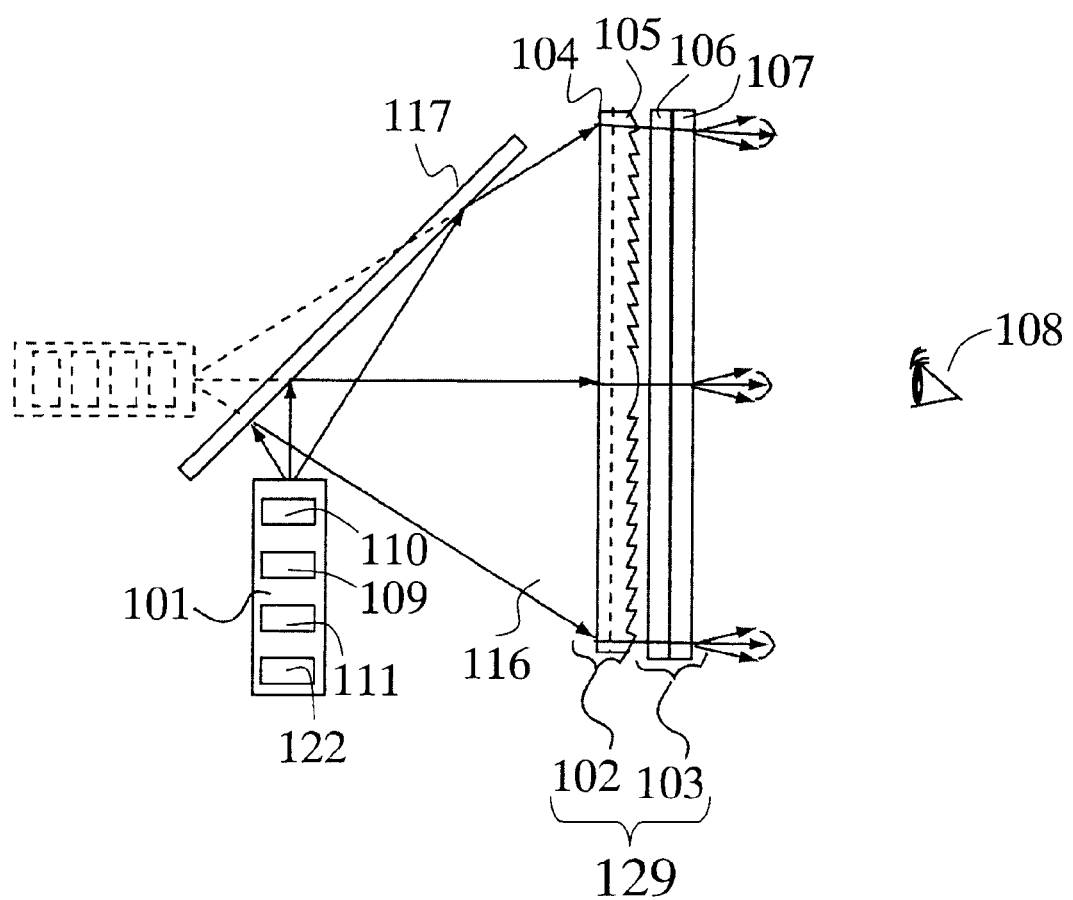
FIG. 14 A view illustrating an example of a rear projection display device according to Embodiment 4 of the present invention.

FIG. 14 illustrates an example of the rear projection display device according to Embodiment 4 of the present invention. The transmission screen 129 of the rear projection display device illustrated in FIG. 14 includes: a Fresnel lens screen (Fresnel optical element) 102 for bending image light 116 from the projector 101 to an observer 108 side; and light diffusion means 103 for diffusing the image light with a divergence angle.

In FIG. 14, the Fresnel lens screen (Fresnel optical element) 102 includes a Fresnel lens substrate 104 and a light exit surface side Fresnel lens 105. The light diffusion means 103 includes a lens element 106 and a light diffusion sheet 107.

As described in Embodiment 2 or 3, the projector 101 illustrated in FIG. 14 includes the light valve 109, the projection optical system 110, the illumination optical system 111, and the light source 122. In FIG. 14, reference numeral 117 denotes a reflection mirror.

According to such a structure, the image light 116 from the projector 101 may be projected to the transmission screen 129. As a result, the image light 116 is bent to the observer 108 side and diffused with the divergence angle, and hence the observer 108 may observe an excellent image.

Embodiment 5

Figure 15:
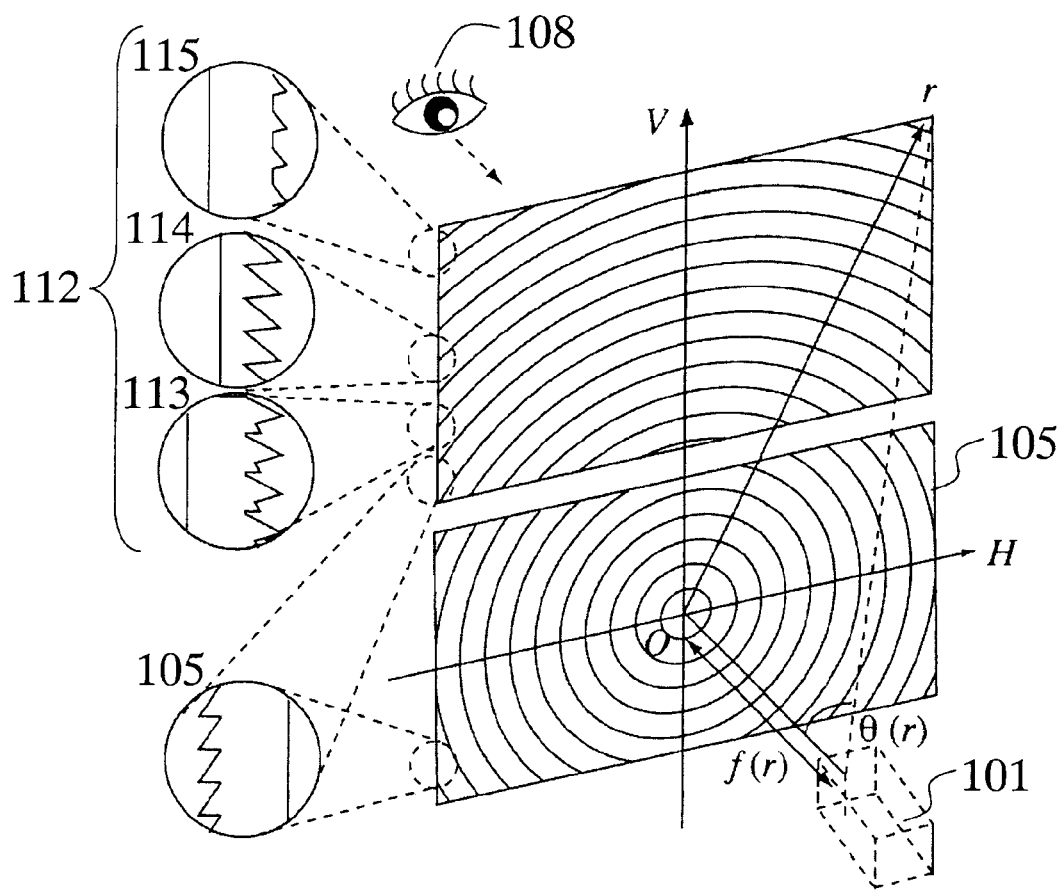
FIG. 15 A view illustrating various Fresnel lenses which may be applied to a transmission screen 129.

Embodiment 5 of the present invention focuses on the Fresnel lens screen 102 of the transmission screen 129 which is used in combination with the projector 101. FIG. 15 illustrates various Fresnel lenses which may be applied to the transmission screen 129. In Embodiment 4, as illustrated in FIG. 14, the light exit surface side Fresnel lens 105 is provided as the Fresnel lens screen 102. However, as illustrated in FIG. 15, a light incident surface side Fresnel lens 112 having a prism formed on a light incident surface side may be also employed depending on an optical system design.

The light incident surface side Fresnel lens 112 is specifically classified into, for example, a light incident surface side total-reflection and refraction Fresnel lens 113, a light incident surface side total-reflection Fresnel lens 114, and a light incident surface side partial total-reflection Fresnel lens 115 (see FIG. 15), each of which has the following features.

The feature of the light incident surface side total-reflection Fresnel lens 114 is that a light flux entering a prism is deflected in a light exit surface direction by total reflection on an opposite surface.

The feature of the light incident surface side partial total-reflection Fresnel lens 115 is that valleys of the total-reflection Fresnel lens 114 are provided parallel to a light exit surface.

The feature of the light incident surface side total-reflection and refraction Fresnel lens 113 is that the total-reflection Fresnel lens 114 and a refraction Fresnel lens for deflecting a light flux entering a prism in a light exit surface direction in only the case of refraction are combined in a single prism.

Figure 16:
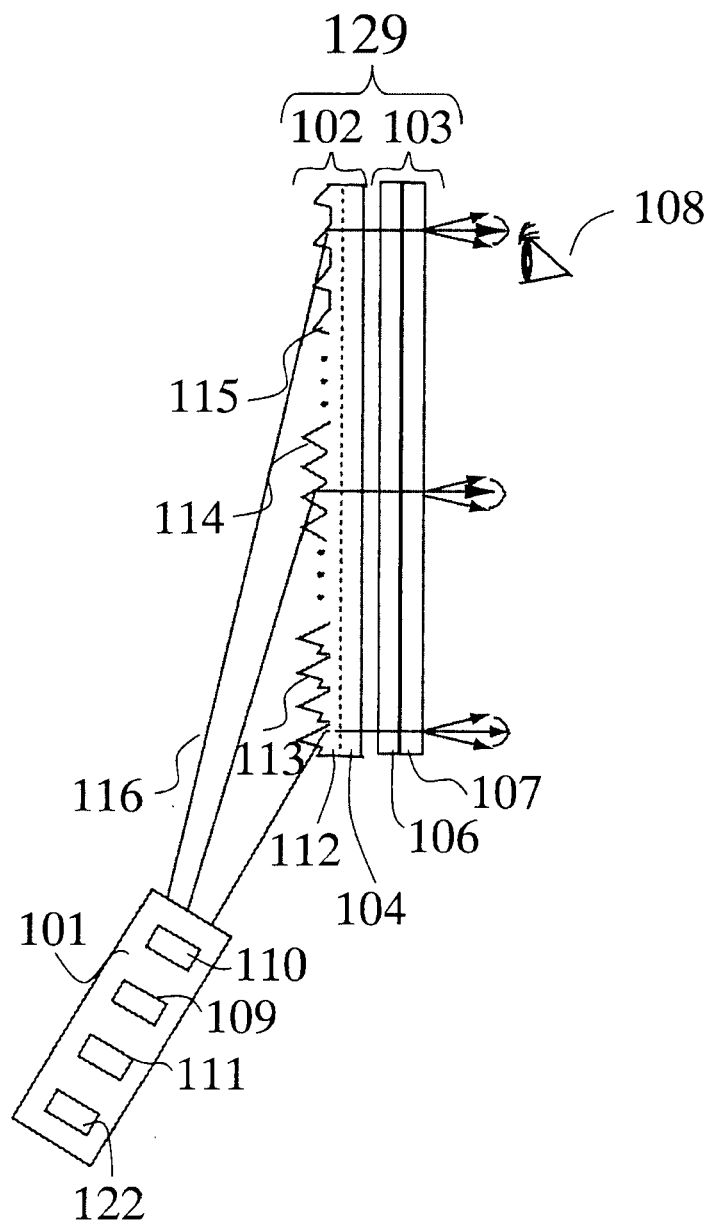
FIG. 16 A view illustrating an example of a rear projection display device in which a projector 101 and a light incident surface side Fresnel lens 112 are combined to each other, according to Embodiment 5 of the present invention.

FIG. 16 illustrates an example of a rear projection display device in which the projector 101 and the light incident surface side Fresnel lens 112 are combined to each other, according to Embodiment 5 of the present invention. The respective Fresnel lenses 113 to 115 may be selected as appropriate depending on a projector design. The three types are not necessarily combined in a single screen. In view of lens shape processing, a part of a tip end of a prism may be chipped substantially parallel to incident light.

The Fresnel optical element 102 is selected based on characteristics of the projector 101 and the light diffusion means 103 is selected based on optical characteristics, for example, a viewing angle and screen brightness. Therefore, in many cases, the Fresnel optical element 102 and the light diffusion means 103 are separately designed and manufactured, and independently selected. In other words, the Fresnel optical element 102 and the light diffusion means 103 may be separately considered.

In the case where the light incident surface Fresnel lens and a lenticular lens screen are combined to each other, the respective independent structures are illustrated for the sake of understanding. In an actual case, the structures may be bonded as a single element to each other through, for example, a bonding layer.

Figure 17:
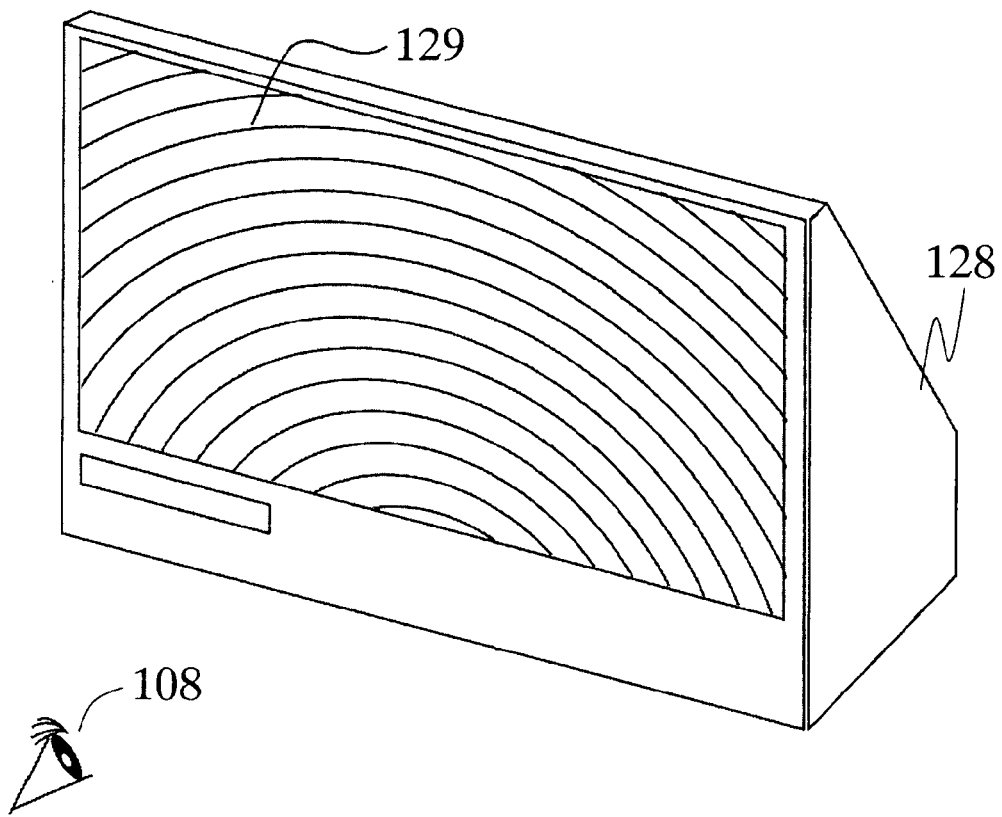
FIG. 17 A view illustrating an example in which the rear projection display device is stored in a cabinet.
Figure 18:
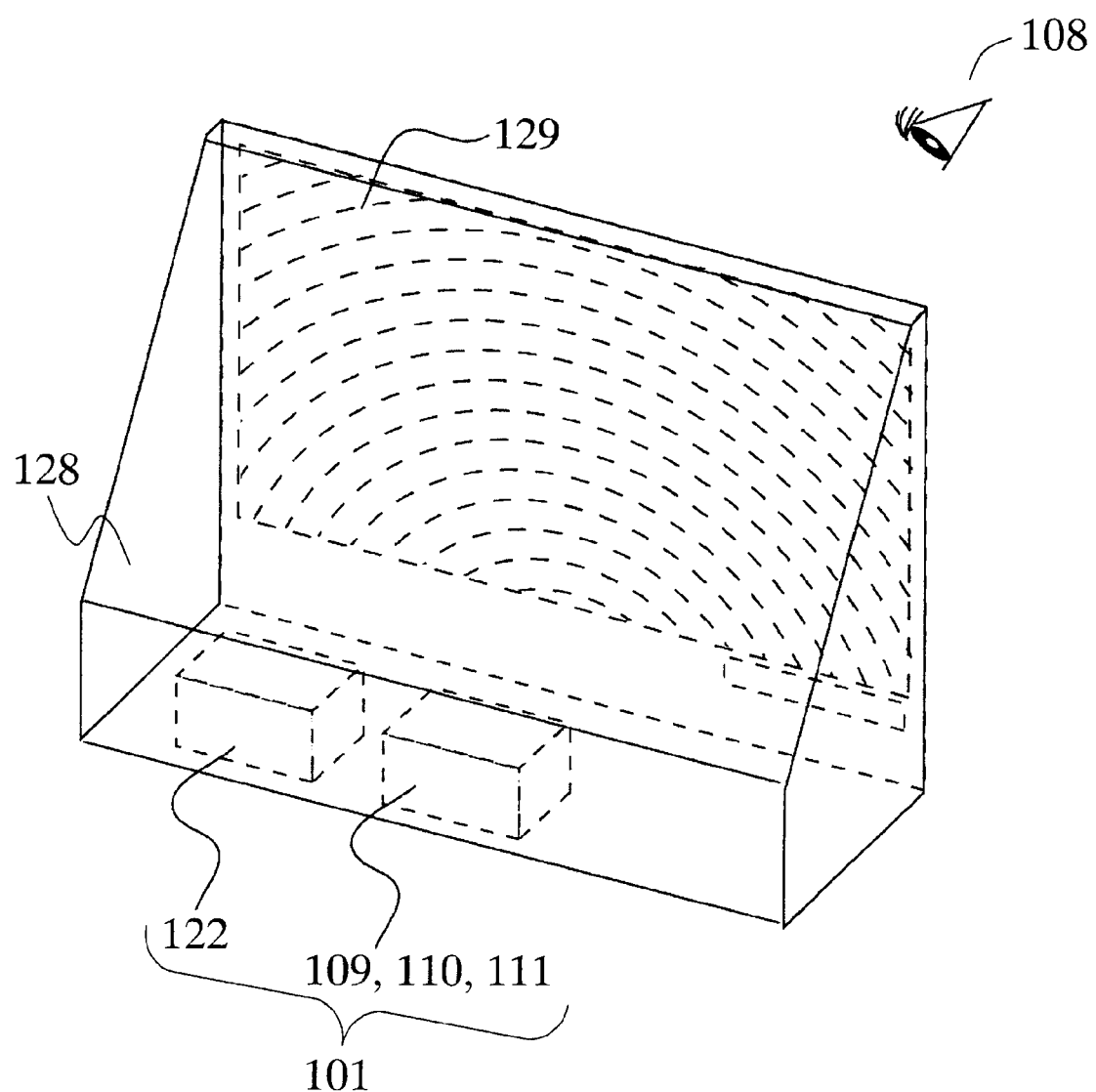
FIG. 18 A view illustrating the example in which the rear projection display device is stored in the cabinet.

In the example of the rear projection display device, the projector 101 and the transmission screen 129 are only described, but generally stored in a cabinet 128 in order to block external light from an ambient environment. This is described with reference to FIGS. 17 and 18. FIGS. 17 and 18 illustrate an example in which the rear projection display device is stored in the cabinet, which is an example in which the transmission screen 129 is provided in the cabinet 128.

In an actual case, as illustrated in FIG. 18, the constituent elements of the projector 101 are arranged in the cabinet 128. In this case, a distance between the projector 101 and the transmission screen 129 corresponds to a depth of the display device.

When the light incident surface side Fresnel lens 112 is employed as the Fresnel lens screen 102 to be combined to the projector 101 as described above, oblique projection may be performed as illustrated in FIG. 16. As a result, for example, as is apparent from comparison with the structure illustrated in FIG. 14, the distance between the projector 101 and the transmission screen 129, that is, the depth may be reduced.

Embodiment 6

Figure 19:
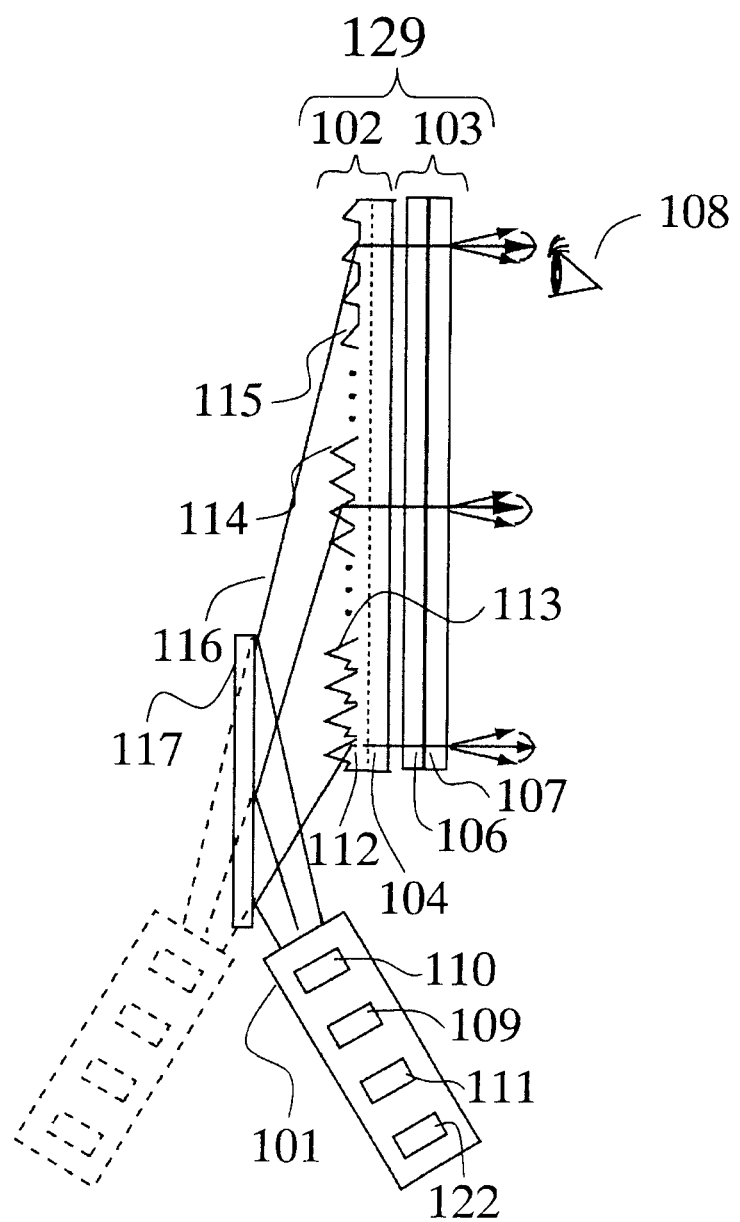
FIG. 19 A view illustrating an example in which a light flux is bent by a reflection mirror 117.
Figure 20:
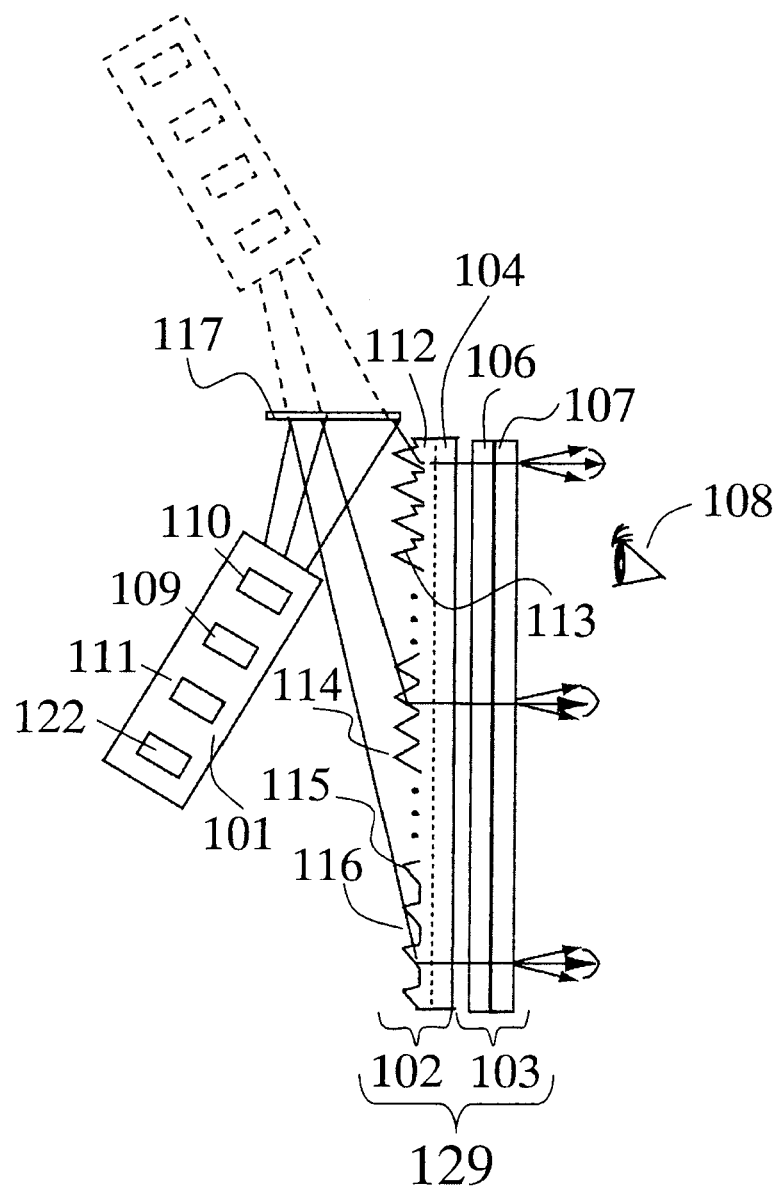
FIG. 20 A view illustrating an example in which a light flux is bent by the reflection mirror 117.

In Embodiment 6 of the present invention, a case where the entire device is further reduced in thickness and size is described. The reflection mirror 117 is provided on an optical path through which the image light 116 passes, between the projector 101 and the transmission screen 129 which are described in Embodiment 5 to bend the light flux. Therefore, the device may be reduced in thickness and size. FIGS. 19 and 20 illustrate examples in which the light flux is bent by the reflection mirror 117. FIG. 19 illustrates the example in which the reflection mirror 117 is provided substantially parallel to the screen 129. FIG. 20 illustrates the example in which the reflection mirror 117 is provided substantially orthogonal to the screen 129.

FIGS. 19 and 20 each illustrate the example in which the reflection mirror 117 is provided substantially parallel or substantially orthogonal to the screen 129. However, the reflection mirror may be tilted relative to the screen. When a turn-back mirror is provided midway in an optical system, an image may be turned upside down, and hence the up-and-down position of the screen is not limited to the illustrated examples.

When the structures as described above are employed, the distance between the projector 101 and the transmission screen 129 may be further reduced as compared with Embodiment 5, or a total volume may be further reduced.

An uppermost surface of the light diffusion means 103 which is located on an observer side may be provided with, as a surface processing layer, for example, an antireflection film for reducing the reflection of light in order to reduce the influence of external light. An antiglare layer for suppressing apparent glare, an antistatic layer for preventing dust from being deposited by static electricity, or a hard coat layer for surface protection may be provided.

In addition, any of a movable stop, communication means, a control signal receiving section, a control device, a holding mechanism, an air conditioner, a speaker, a television set, an electrical circuit, a geometrical correction circuit, and a color correction circuit may be provided as a constituent element.

The invention claimed is:

1. A laser illumination device, comprising:
    a plurality of light source modules each including:
        a plurality of light source units, in each of which a semiconductor laser, and a laser medium and a nonlinear material which are flat-shaped and have a waveguide structure are arranged on the same plane, for performing continuous oscillation in a waveguide mode of the laser medium; and
        a first optical system for coupling laser oscillation beams from the plurality of light source units;
    a second optical system for coupling laser light beams propagating from the plurality of light source modules through first optical fibers and a second optical fiber array;
    a uniformization element for uniformizing a laser light beam from the second optical system; and
    a third optical system for projecting the laser light beam uniformized through the uniformization element, to a substrate which is an illuminated surface at a predetermined magnification, to produce an illumination light flux.

2. A laser illumination method, comprising the steps of:
    coupling laser oscillation beams from a plurality of light source units by a plurality of light source modules,
        the plurality of light source modules each including:
            the plurality of light source units, in each of which a semiconductor laser, and a laser medium and a nonlinear material which are flat-shaped and have a waveguide structure are arranged on the same plane, for performing continuous oscillation in a waveguide mode of the laser medium; and
            a first optical system for coupling laser oscillation beams from the plurality of light source units;
    coupling, by a second optical system through a second optical fiber array, laser light beams propagating from the plurality of light source modules through first optical fibers;
    uniformizing a laser light beam from the second optical system by a uniformization element; and
    projecting, by a third optical system, the laser light beam uniformized through the uniformization element, to a substrate which is an illuminated surface at a predetermined magnification, to produce an illumination light flux.

3. A semiconductor element manufacturing method, comprising a polycrystallization step of:
    using the laser illumination method according to claim 2 to temporally continuously drive the semiconductor laser; and
    forming a polycrystal silicon film on a surface of the substrate while a relative position of the substrate is adjusted to align a surface of the substrate to the illuminated surface.

4. A projection display device, comprising:
    a light source including a plurality of light source modules each including:
        a plurality of light source units, in each of which a semiconductor laser, and a laser medium and a nonlinear material which are flat-shaped and have a waveguide structure are arranged on the same plane, for performing continuous oscillation in a waveguide mode of the laser medium; and
        a first optical system for coupling laser oscillation beams from the plurality of light source units;
    an illumination optical system including:
        a second optical system for coupling laser light beams propagating from the plurality of light source modules through first optical fibers and a second optical fiber array;
        a uniformization element for uniformizing a laser light beam from the second optical system; and
        a third optical system for illuminating a light valve which is an illuminated surface with the laser light beam uniformized through the uniformization element; and
    a projection optical system for projecting an image formed by the light valve at a predetermined magnification.

5. A projection display device according to claim 4, further comprising a transmission screen for displaying the image projected by the projection optical system.

6. An image display method using a projection display device, comprising:
    a first step of emitting laser light beams from a plurality of light source modules each including:
        a plurality of light source units, in each of which a semiconductor laser, and a laser medium and a nonlinear material which are flat-shaped and have a waveguide structure are arranged on the same plane, for performing continuous oscillation in a waveguide mode of the laser medium; and
        a first optical system for coupling laser oscillation beams from the plurality of light source units;
    a second step of coupling the laser light beams propagating through first optical fibers and a second optical fiber array, uniformizing a laser light beam obtained by the coupling, and illuminating a light valve which is an illuminated surface with the uniformized laser light beam; and
    a step of projecting an image formed by the light valve at a predetermined magnification.

* * * * *